United States Patent
Nguyen et al.

(10) Patent No.: US 6,472,315 B2
(45) Date of Patent: Oct. 29, 2002

(54) METHOD OF VIA PATTERNING UTILIZING HARD MASK AND STRIPPING PATTERNING MATERIAL AT LOW TEMPERATURE

(75) Inventors: Phi L. Nguyen, Hillsboro, OR (US); Lawrence D. Wong, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/808,758

(22) Filed: Mar. 14, 2001

(65) Prior Publication Data

US 2001/0016405 A1 Aug. 23, 2001

Related U.S. Application Data

(62) Division of application No. 09/050,707, filed on Mar. 30, 1998, now abandoned.

(51) Int. Cl.[7] ............................................. H01L 21/4763
(52) U.S. Cl. ........................ 438/637; 438/638; 438/672; 438/725
(58) Field of Search ................................ 438/618, 620, 438/622, 624, 629, 636, 637, 638, 652, 672, 700, 725, 669, 736, 735, 671, 745

(56) References Cited

U.S. PATENT DOCUMENTS

| | | | | | |
|---|---|---|---|---|---|
| 4,983,490 A | * | 1/1991 | Durham | ........................ | 430/169 |
| 5,362,608 A | * | 11/1994 | Flaim et al. | ................. | 430/327 |
| 5,759,736 A | * | 6/1998 | Nishi et al. | ................... | 430/190 |
| 5,886,410 A | | 3/1999 | Chiang et al. | | |
| 5,924,005 A | * | 7/1999 | Waldo | ......................... | 438/623 |
| 5,968,848 A | * | 10/1999 | Tanabe et al. | ................ | 438/745 |

FOREIGN PATENT DOCUMENTS

JP    11084688 A   *  3/1999   ............. G03F/7/42

* cited by examiner

*Primary Examiner*—Carl Whitehead, Jr.
*Assistant Examiner*—Maria Guerrero
(74) *Attorney, Agent, or Firm*—Blakely, Sokoloff, Taylor & Zafman LLP

(57) ABSTRACT

A method for fabricating an interconnect system is provided. A low dielectric constant layer (LDCL) is formed onto a substrate. A hard mask is formed onto the LDCL. A patterning material is formed onto the hard mask. The patterning material is via patterned. A via pattern of the patterning material is transferred to the hard mask. The patterning material is stripped at a substantially low temperature. Vias are formed through the LDC using a via pattern formed in the hard mask.

6 Claims, 5 Drawing Sheets

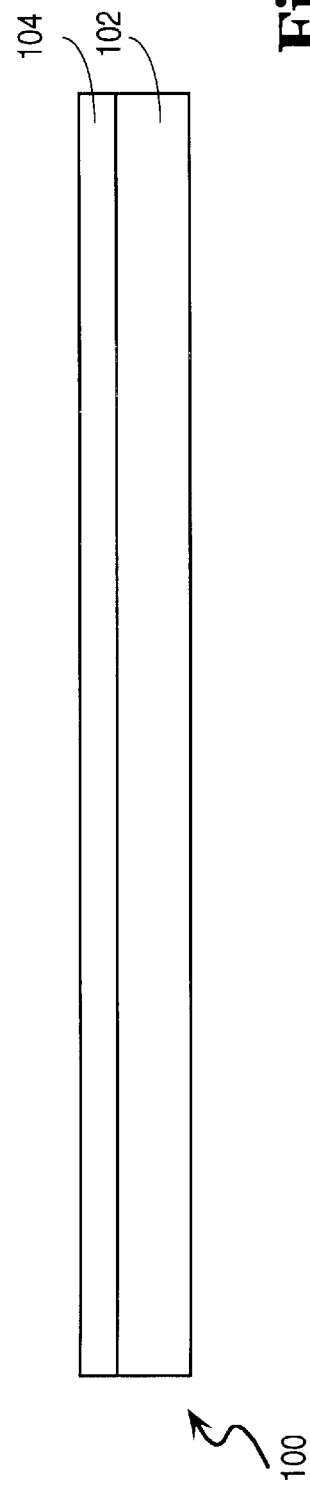
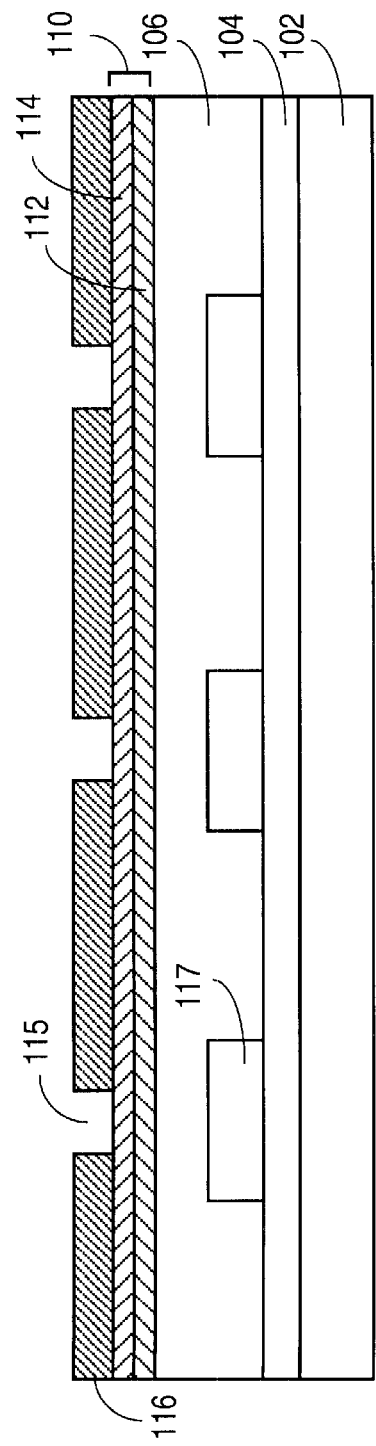

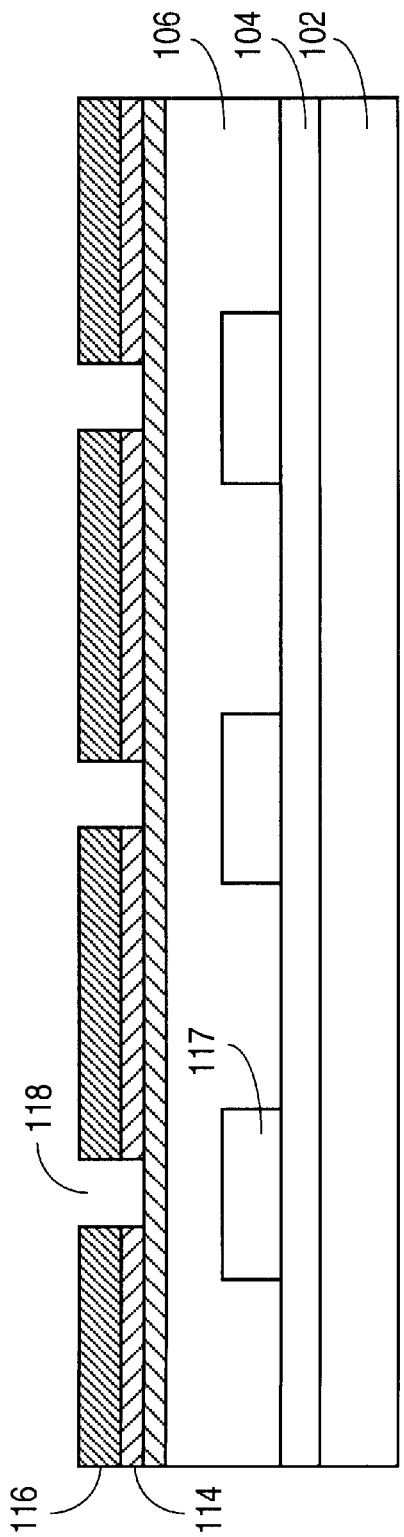
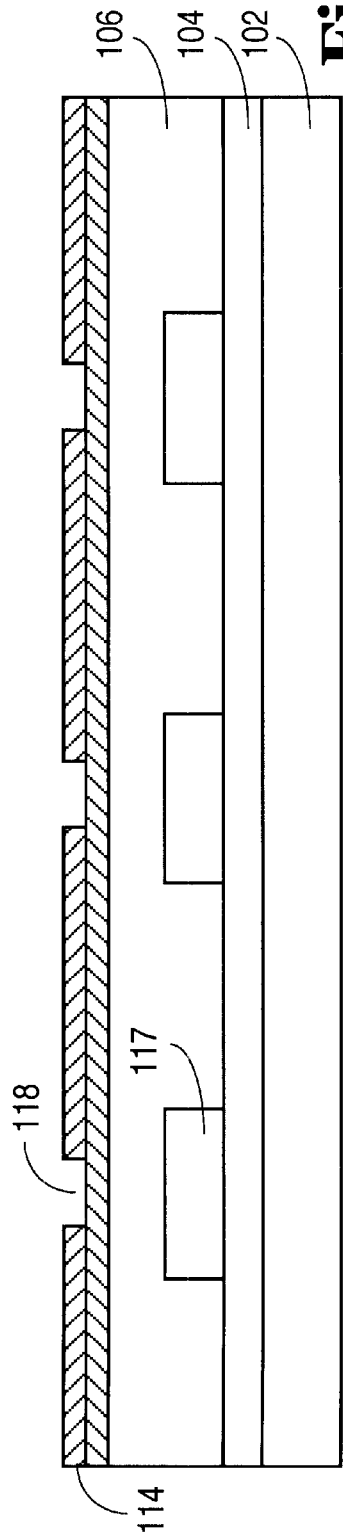

METHOD OF VIA PATTERNING UTILIZING HARD MASK AND STRIPPING PATTERNING MATERIAL AT LOW TEMPERATURE

This application claims the benefit of the earlier filing date of application of Phi L. Nguyen and Lawrence D. Wong entitled, "A Method for Forming An Interconnect System Using A Low Dielectric Constant Layer," Ser. No. 09/050,707, filed Mar. 30, 1998 now abandonment and incorporated herein by reference.

BACKGROUND OF THE INVENTION (1) Field of the Invention

The present invention generally relates to fabrication of interconnect systems. More specifically, the present invention relates to fabrication of via plugs in interconnect systems that include low dielectric constant materials.

(2) Description of the Related Art

Modern integrated circuits are generally made up of a silicon substrate containing millions of active and passive devices including transistors, capacitors, and resistors. Such devices are initially isolated from one another, but are later interconnected together to form functional circuits. The quality of the interconnection of these devices drastically affects the performance and reliability of the fabricated integrated circuit. An interconnect system typically includes metal lines, spaced apart from each other, with dielectric layers therebetween that isolate the metal lines from one another. The metal lines typically interconnect the various active and passive devices residing in a silicon wafer to which the interconnect system is coupled.

Inherent in the structure of the interconnect system is a capacitance associated with the metal lines and the distance therebetween, i.e., inter-metal-line capacitance (hereinafter "capacitance"). Decreasing this capacitance is desirable as several advantages can be achieved therefrom, such as reduced RC delay, reduced power dissipation, and reduced cross-talk between the metal lines. As the capacitance is inversely proportional to the distance between the metal lines, one way to reduce the capacitance formed between the lines of an interconnect system would be to increase the space between these lines. However, this option is not desirable because of limitations imposed by packing density.

However, as the capacitance of an interconnect system is also directly proportional with the dielectric constant of a dielectric disposed between these lines, a better way to reduce the capacitance of the interconnect system is to utilize a dielectric material with a low dielectric constant. Typically, interconnect systems use a dielectric material such as silicon dioxide ($SiO_2$). The dielectric constant of $SiO_2$ is approximately 4. Other dielectric materials that are used in interconnect systems include silicon oxyfluoride (SiOF), with a dielectric constant of 3.5 and below.

Incorporating dielectric materials with low dielectric constants in interconnect systems, however, is problematic. Low dielectric materials, such as organic polymers, may not adequately mechanically support the structure of the interconnect system as these materials are mechanically weak. Moreover, low dielectric constant materials such as organic polymers are vulnerable to certain processes involved in the fabrication of the interconnect system. For example, polymers have to withstand high temperatures and mechanical stresses at which the interconnect system is subjected. Also, polymers used in an interconnect system interact with photoresist solvents and developers used in the process of fabrication of the interconnect system. Moreover, polymers are vulnerable to exposure to photoresist solvents and developers as the polymers may dissolve in the solvents or developers and swell. Furthermore, polymers are vulnerable to oxygen plasma used in ashing.

An interconnect system typically utilizes via plugs made of tungsten (W), by way of non-limiting example, that interconnect the various layers of metal lines within the interconnect system. The vias plugs connect various layers of metal lines therebetween within the interconnect system. The process of connecting devices by interconnects is known as metallization. Current semiconductor fabrication processes typically utilize aluminum as metal for interconnects. Aluminum is superior to the other metals, such as copper, gold, and silver, for example, in terms of relative ease of deposition and patterning onto the semi-conductor substrate.

Once the via plugs are formed in an interconnect system, the via plugs are subjected to a process of chemical mechanical polishing (CMP), wherein a CMP slurry solution is used to polish and thereby planarize the outer parts of the via plugs. The CMP slurry solution, however, may cause deterioration or contamination of the polymer within which the via plugs are formed, if the interconnect system utilizes a polymer.

Low dielectric polymers suffer of other deficiencies that may discourage their incorporation in interconnects and formations of vias therein. The low dielectric polymer material may interact with via barrier and plug formation. Low dielectric constant polymer materials may interact in tungsten CMP processes. Also, low dielectric polymer materials have lower thermal stability (relative to silicon oxides).

With continued device scaling technology, it becomes more important to both reduce and control the interconnect thermal budget in processing. High temperature processing, after device formation, may have an adverse effect in transistor performance. Once the devices have been created, it is desirable to create the interconnects as low as possible processing temperature history. Typically, the photoresist is stripped at a temperature that may exceed 200 to 420 degrees Celsius when oxygen plasma or a microwave discharge is used.

It is desirable to provide an interconnect system that may accommodate the above-mentioned shortcomings of polymers or materials similar thereto.

BRIEF SUMMARY OF THE INVENTION

The present invention provides a method for fabricating an interconnect system. A low dielectric constant layer (LDCL) is formed onto a substrate. A hard mask is formed onto the LDCL. A patterning material is formed onto the hard mask. The patterning material is via patterned. A via pattern of the patterning material is transferred to the hard mask. The patterning material is stripped at a substantially low temperature. Vias are formed through the LCDL using a via pattern formed in the hard mask.

BRIEF DESCRIPTION OF THE DRAWINGS

The features, aspects, and advantages of the present invention will become more fully apparent from the following Detailed Description, appended claims, and accompanying drawings in which:

FIG. 1 illustrates a cross-section of a first layer of dielectric deposited on a substrate of an interconnect system according to one embodiment of the present invention;

FIG. 2 shows a cross-section of the interconnect system of FIG. 1, with a patterning layer of photoresist formed upon the hard mask according to one embodiment of the present invention;

FIG. 3 shows a first hard mask layer etched, according to the pattern defined by the photoresist mask, according to one embodiment of the present invention;

FIG. 4 shows a cross-section of the interconnect system, with the patterning layer stripped, according to one embodiment of the present invention;

DETAILED DESCRIPTION OF THE INVENTION

Figure 5:
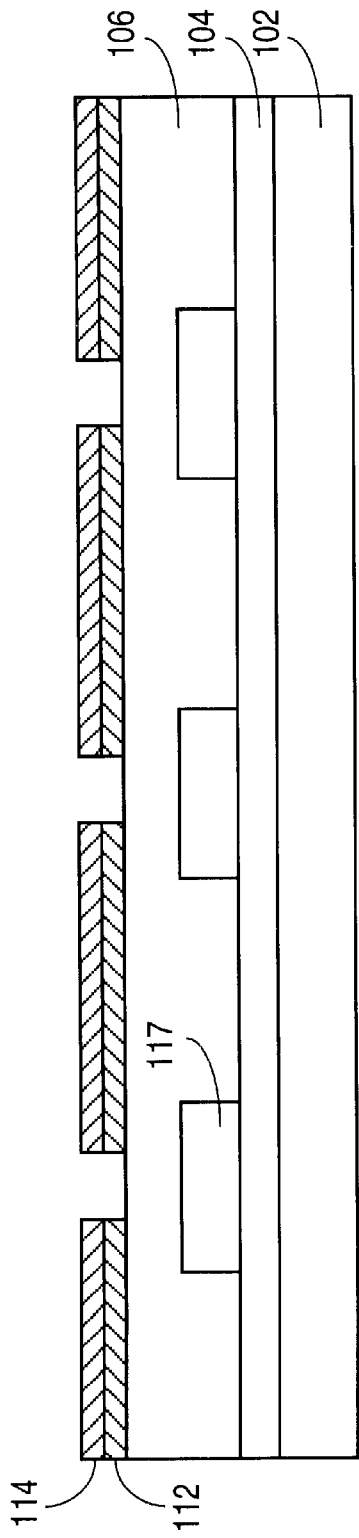
FIG. 5 illustrates a cross-section of the interconnect system, with a second layer of the hard mask etched through in accordance with the via pattern formed in the first hard mask layer, according to one embodiment of the present invention.

In the following description, numerous specific details are set forth to provide a thorough understanding of the present invention. However, one having an ordinary skill in the art will recognize that the invention can be practiced without these specific details. In some instances, well-known circuits, structures and techniques have not been shown in detail to avoid unnecessarily obscuring the present invention.

FIG. 1 illustrates a cross-section of an interconnect system 100 according to one embodiment of the present invention. The interconnect system 100 includes a silicon substrate 102. Silicon substrate 102 may be, by way of non-limiting example, a semiconductor wafer including device regions such as diffused junctions, other structures such as gates, local interconnects, metal layers, or other active or passive device structures or layers. In many cases, depending upon the device being fabricated (interconnect-system for example), device layers or structures, or processing steps used to fabricate the device according to the present invention, may have been omitted to avoid unnecessarily obscuring the present invention.

The interconnect system 100 also includes a first dielectric layer 104 formed upon substrate 102. The first dielectric layer 104 serves the purpose of insulating between any conductive structures which may be found in the silicon substrate 102 and other conductive layers or lines which are further formed in the interconnect system 100. First, dielectric layer 104 typically has a dielectric constant which is substantially equal to 4. The first dielectric layer 104 typically has a thickness in the range of approximately a few thousand Angstroms. For example, the thickness of layer 104 may be approximately 6,000 Å. The first dielectric layer 104 may be made of materials such as, but not limited to: silicon dioxide ($SiO_2$), undoped or doped using dopants such as Phosphorus (PSG, Silicate Glass) or Boron and Phosphorus (BPSG, Doped Silicate Glass); silicon nitride ($Si_3N_4$); or silicon oxi-nitride ($SiO_XN_Y$).

A first level of at least two electrically conductive interconnect lines 117, which are typically made of aluminum, are formed upon the first dielectric layer 104. The interconnect lines 117 may be formed by depositing a layer of a first electrically conductive material such as aluminum or an alloy thereof upon the first dielectric layer 104. Following the deposition of this first electrically conductive layer, a patterning layer such as photoresist layer (not shown) is formed. The photoresist layer is patterned by well known techniques, which include masking the layer of photoresist, exposing the masked layer of photoresist to light, and then developing the portions not exposed to light. The layer of electrically conductive material is then etched in alignment with the pattern formed in the photoresist layer thereby producing the pattern of interconnect lines 117 shown in FIG. 2. In one embodiment of the present invention, the electrically conductive lines 117 have a thickness in the range of 4000–10,000 Angstroms, but the present invention is not limited to such thickness range.

Once the electrically conductive interconnect lines 117 are etched as explained above, a material with a low dielectric constant (LDC) is deposited upon and therebetween interconnect lines 117 thereby forming region 106. The low dielectric constant of the LDC preferably has a value in the range of 1.5–3.5, although this value may be higher. In the embodiment shown in FIG. 2, the region 106 of material with a low dielectric constant may include a polymer or amorphous-fluorocarbon (a-F:C) by way of non-limiting example with a thickness in the range of a few thousand Angstroms. Acceptable polymers are ones that are stable at high temperatures, since most polymers tend to decompose at high temperatures The temperatures at which the polymers may be stable are generally temperatures within the range of 380–450° C., which are compatible with integrated circuit process temperatures. Organic materials, such as polyarylether, polynaphthalene, parylene, or amorphous fluorocarbons, (a-F:C) which are stable at high temperatures may be used for layer 106. The polymer region 106 confers the interconnect system 100 a low inter-metal capacitance as the inter-metal capacitance, generally, is proportional with the dielectric constant of the material interposed between metal lines.

Following formation of polymer region 106, hard mask 110, which improves the mechanical strength of the interconnect system, is deposited upon polymer region 106. Hard mask 110 is typically made of $SiO_2$ or may be a dual layer hard mask including a first hard mask layer 112 of $Si_3N_4$ and a second hard mask layer 114 of $SiO_2$. Materials of which hard masks may be made include SiC, a-C, BN, $SiO_2$ or $Si_3N_4$ but are not limited to this group of materials. Hard mask 110 has a higher dielectric constant than the dielectric constant of polymer of region 106. For example, the dielectric constant of the hard mask 110 is approximately 4 while the polymers used for region 106 have an average dielectric constant of approximately 2.2–3.0. The hard mask 110 typically has a thickness sufficient to withstand process steps such as chemicol mechnaical polishing (CMP), metal etch, etc., involved in the fabrication of the interconnect system according to the present invention. Each of these processes may erode part of the hard mask and therefore the thickness of the hard mask is designed to insure that the various processes the interconnect system undergoes do not fully erode hard mask 110. The layer of hard mask 112 may have a thickness in the range of 200–2000 Å, and the layer of hard mask 114 may have a thickness in the range of 200–2000 Å, for example. By way of example, an average thickness of the polymer region measured from a top surface of the metal lines 117 to a bottom surface of hard mask 110 may be in the range of approximately 6000–7000 Å.

FIG. 2 shows a cross-section of the interconnect structure illustrated in FIG. 1 with a patterning layer 116 (photoresist layer) formed upon hard mask 110. and the structures such as electrically conductive interconnect lines 117, polymer region 106 and hard mask 110. A photoresist layer 116 is formed on top of hard mask layer 114. The photoresist layer 116 can have a thickness of approximately a few thousand Angstroms to a micron. Photoresist layer 116 is made of a suitable photosensitive material and is processed using standard techniques. An oxide etch then follows through photoresist 116, forming openings 115, positioned at places where the hard mask 110 will subsequently be etched.

FIG. 3 shows second hard mask layer 114 etched, according to the pattern defined by the photoresist mask 116, with an etchant having a high selectivity to the second hard mask layer 114 ($SiO_2$) relative to the first hard mask layer 112 ($Si_3N_4$) beneath the hard mask 114. Once the second hard mask 114 is etched, the via pattern of the photoresist 116 is transferred to second hard mask 114 that displays a pattern with openings 118 therethrough as shown in FIG. 3. The hard mask 114 with the pattern of openings 118 therethrough is thereafter used as a mask in the subsequent process of etching hard mask 112.

The photoresist 116 is then removed (FIG. 4) at a low temperature process relative to temperatures used in conventional techniques. Almost room-temperature stripping is performed on photoresist 116. The photoresist is essentially dissolved in a solution that includes inter alia, ethylene glycol monethyl ether acetate (EGMEA), propylene glycol monoethyl ether acetate (PGMEA), ethyl lactate (EL), ethyl pyruvate (EP), methyl-3-methoxy propionate (MMP). By effective use of a dual hardmask (viz. patterning of the second hard mask layer 114 ($SiO_2$) and not of the first hard mask layer 112 ($Si_3N_4$)), the photoresist may be selectively removed without attack of the low-k dielectric. 106 by a low temperature scheme. Conventional plasma or microwave ashing of photoresist is eliminated.

The dual layer of hard mask 110 provides a differential etch stop. The top part of the hard mask (hard mask layer 114) may be used to transfer the pattern directly to the subsequent remainder layer 112 of the hard mask. This provides more precision to the etching of vias subsequently done through the polymer layer 106.

Etching is then continued at FIG. 5, where portions of the first hard mask layer 112 corresponding to the pattern of openings 118 are removed by using an etchant such as $CF_4$, $C_2F_6$, $SF_6$, etc. that is more selective to the portion 112 of the hard mask than to the polymer 116.

Figure 6:
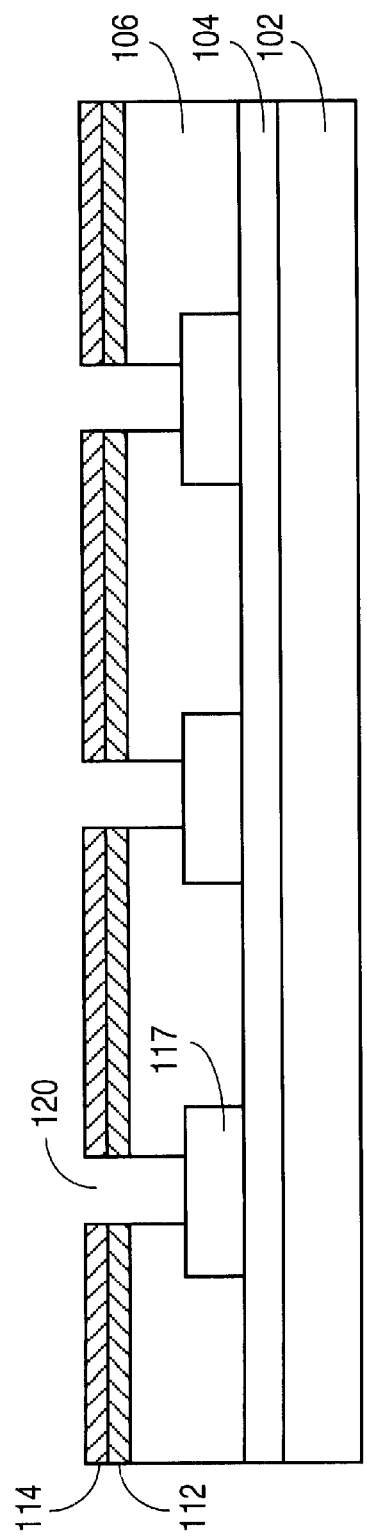
FIG. 6 illustrates a cross-section of the interconnect system, with vias patterned into a low-dielectric-constant (low-k) polymer layer, according to one embodiment of the present invention.

In FIG. 6, the interconnect system 100 is shown with openings, or vias 120, patterned into the low dielectric polymer layer 116 by a conventional process of etching. By utilizing the embodiment of the process of the present invention described herein over-etching and long-term exposure of the bottom of the via 120 to oxygen is reduced or eliminated since the photoresist is removed before the via 120 is produced through the polymer. The process is usable in both landed or unlanded via schemes. FIGS. 1–9 represent the process for the landed scheme.

Figure 7:
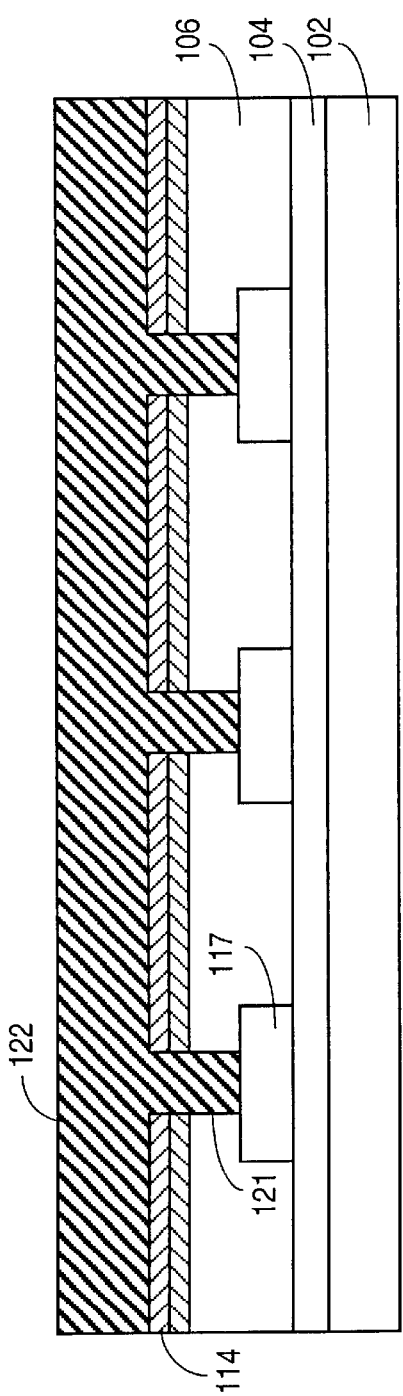
FIG. 7 shows an interconnect system with a layer of electrically conductive material, formed upon the hard mask and in the vias, according to one embodiment of the present invention.

FIG. 7 shows a cross-section through interconnect system 100 with a layer 122 of electrically conductive material such as Tungsten (W) formed upon hard mask 110 and into vias 120. The electrically conductive material is blanket deposited upon hard mask 110 and into vias 120 by a process of chemical vapor deposition (CVD), which is well known in the art.

Figure 8:
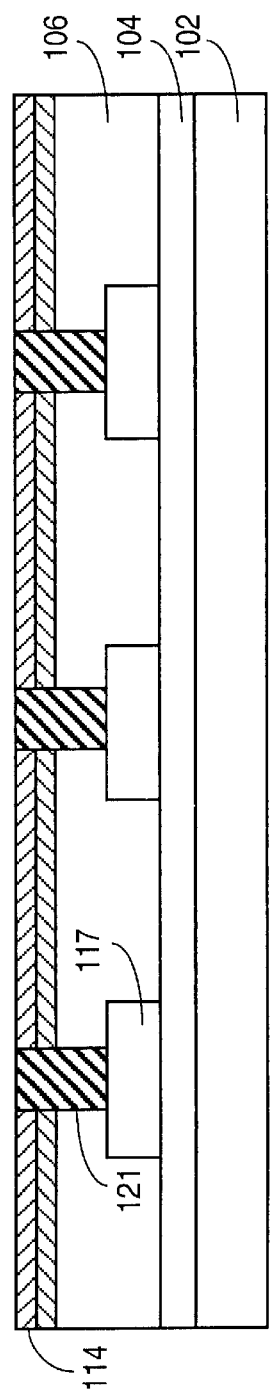
FIG. 8 illustrates a cross-section through the interconnect system, with via plugs formed into the low-k polymer layer, according to one embodiment of the present invention.

Following the Tungsten blanket deposition, a process of chemical mechanical polishing (CMP) is applied to the layer of Tungsten 122 thereby providing the interconnect system shown in FIG. 8. The CMP process ensures that the top surface of each via plug 121 is planarized and the rest of the Tungsten, deposited on top of hard mask 110 is removed. Via plugs 121 serve the purpose of electrically interconnecting electrically conductive interconnect lines 117 with other interconnect lines (not shown) which are further deposited upon hard mask 110. A CMP slurry, used in the CMP process, is selected to have a higher selectivity to Tungsten than to hard mask 110. The slurry may, by way of non-limiting example, be Silica or Alumina with an Oxidizer. The CMP slurry may contaminate the polymer region 106. The hard mask 110 prevents the contamination of polymer region 106 by the CMP slurry. The hard mask 110 also works as a CMP stop layer.

Figure 9:
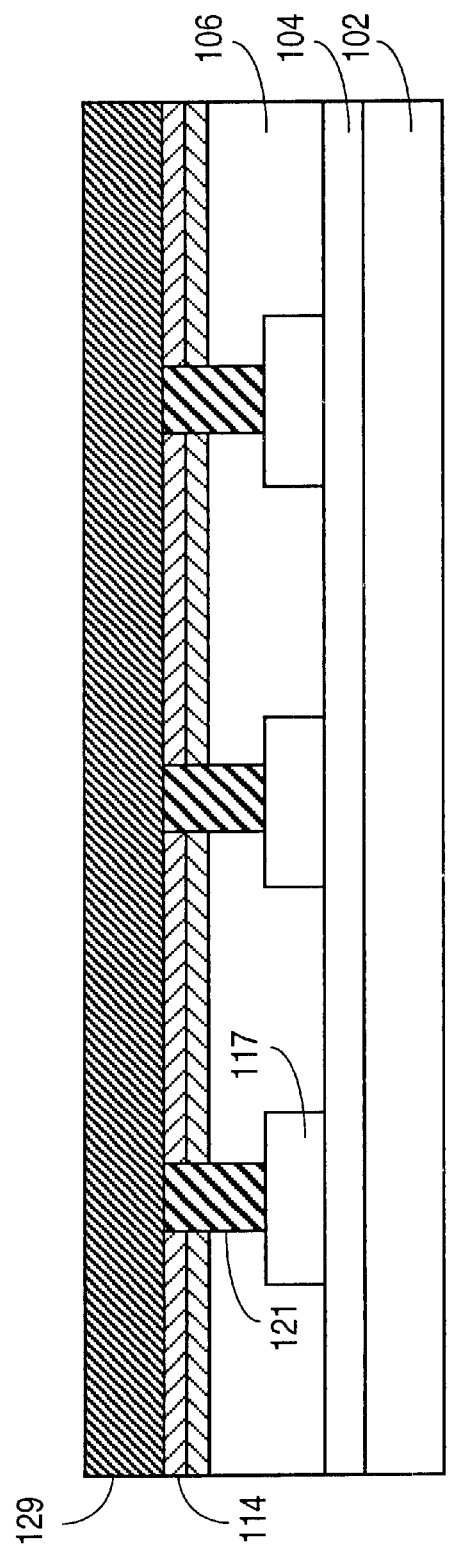
FIG. 9 illustrates the interconnect system, with a layer of metal deposited over the hard mask and in electrical contact with the via plug, according to one embodiment of the present invention.

FIG. 9 illustrates the interconnect system with a layer of metal 129 deposited over the hard mask 110 and in electrical contact with via plugs 121. This layer of metal may be used to form a new level of interconnect lines that are electrically connected to interconnect lines 117 through via plugs 121.

The hard mask 110 thus serves multiple purposes. First, it serves the purpose of a patterning mask for defining via holes, at lower temperatures, into the polymer. The hard mask 110 also serves as a barrier protection against the photoresist strip etchant process, which is performed to strip the photoresist material left at via patterning. Additionally, the hard mask serves as a barrier protection when the upper level of conductive lines is patterned. Moreover, the hard mask serves as a Tungsten CMP stop during the process of CMP of the tungsten. Furthermore, hard mask 110 serves the purpose of metal patterning etch stop which prevents a polymer from being attacked as a result of a metal patterning process performed on the metal disposed on top of the hard mask.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the, appended claims.

What is claimed is:

1. A method, comprising:

forming a low dielectric constant layer (LDCL) onto a substrate;

forming a hard mask onto said LDCL;

forming a patterning material onto said hard mask;

via patterning said patterning material;

transferring a via pattern of said patterning material to said hard mask;

stripping said patterning material by applying a solvent to said patterning material at a substantially low temperature, the solvent consists essentially of ethylene glycol monethyl ether acetate, propylene glycol monethyl ether acetate, ethyl lactate, ethyl pyruvate, and methyl-3-methoxy propionate; and forming vias through said LDCL using a via pattern formed in said hard mask.

2. The method of claim 1, wherein a substantially low temperature is less than 200° C.

3. The method of claim 1, wherein a substantially low temperature is approximately room temperature.

4. A method, comprising:

forming a low dielectric constant layer (LDCL) having a dielectric constant about in the range of 3.5 or less onto a substrate;

forming a first hard mask onto said LDCL and forming a second hard mask onto said first hard mask;

forming a patterning material onto said second hard mask;

via patterning said patterning material;

transferring a via pattern of said patterning material to said first hard mask;

stripping said patterning material at a substantially low temperature with a stripping material consisting of ethylene glycol monethyl ether acetate, propylene glycol monethyl ether acetate, ethyl lactate, ethyl pyruvate, and methyl-3-methoxy propionate; and forming via openings through said LDCL using a via pattern formed in said first hard mask.

5. The method of claim 4, wherein a substantially low temperature is less than 200° C.

6. The method of claim 4, wherein a substantially low temperature is approximately room temperature.

* * * * *

UNITED STATES PATENT AND TRADEMARK OFFICE
CERTIFICATE OF CORRECTION

PATENT NO.    : 6,472,315 B2               Page 1 of 1
DATED         : October 29, 2002
INVENTOR(S)   : Nguyen et al.

It is certified that error appears in the above-identified patent and that said Letters Patent is hereby corrected as shown below:

Column 5,
Line 62, after "before the", delete "via", insert -- vias --.

Signed and Sealed this

Eighth Day of April, 2003

JAMES E. ROGAN
*Director of the United States Patent and Trademark Office*